United States Patent
Martinis

(10) Patent No.: US 11,038,094 B1
(45) Date of Patent: Jun. 15, 2021

(54) SUPERCONDUCTING QUBIT WITH TAPERED JUNCTION WIRING

(71) Applicant: Quantala LLC, Santa Barbara, CA (US)

(72) Inventor: John M. Martinis, Santa Barbara, CA (US)

(73) Assignee: Quantala LLC, Santa Barbara, CA (US)

( * ) Notice: Subject to any disclaimer, the term of this patent is extended or adjusted under 35 U.S.C. 154(b) by 0 days.

(21) Appl. No.: 17/152,397

(22) Filed: Jan. 19, 2021

(51) Int. Cl.
  *H01L 39/02* (2006.01)
  *H01L 27/18* (2006.01)
  *G06N 10/00* (2019.01)
  *H01L 39/22* (2006.01)

(52) U.S. Cl.
  CPC .......... *H01L 39/025* (2013.01); *G06N 10/00* (2019.01); *H01L 27/18* (2013.01); *H01L 39/223* (2013.01)

(58) Field of Classification Search
  CPC ...... H01L 39/025; H01L 27/18; H01L 39/223
  See application file for complete search history.

(56) References Cited

U.S. PATENT DOCUMENTS

| | | | |
|---|---|---|---|
| 2019/0363128 A1* | 11/2019 | Rosenblatt | H01L 27/18 |
| 2020/0266234 A1* | 8/2020 | Boothby | G06N 10/00 |
| 2020/0343434 A1* | 10/2020 | Rubin | G06N 20/10 |
| 2020/0358430 A1* | 11/2020 | Tan | H03K 5/00006 |

OTHER PUBLICATIONS

Wenner, J. et al., "Surface loss simulations of superconducting coplanar waveguide resonators," Applied Physics Letters, vol. 99, 113513, Sep. 15, 2011, pp. 1-3.

* cited by examiner

*Primary Examiner* — Matthew L Reames
(74) *Attorney, Agent, or Firm* — Fenwick & West LLP

(57) ABSTRACT

Error correction can only work with superconducting qubits if qubit errors are lowered. Surface loss from thin oxides is currently a dominant error mechanism. Formulas for useful qubit geometries are presented to predict surface loss, which can be used to optimize the qubit layout. A significant fraction of surface loss comes from the small wire that connects the Josephson junction to the qubit capacitor. Tapering this wire is shown to significantly lower its loss, as well as etching the underlying silicon to create free-standing wires.

12 Claims, 4 Drawing Sheets

SUPERCONDUCTING QUBIT WITH TAPERED JUNCTION WIRING

BACKGROUND

This invention relates generally to quantum computing, and more particularly to reducing qubit energy decay.

Quantum computers perform calculations that cannot be run by classical supercomputers, such as efficient prime factorization or solving how molecules bind using quantum chemistry. Such difficult problems can only be solved by embedding the algorithm in a large quantum computer that is running quantum error correction. However, error correction fails when physical quantum bit (qubit) errors are large.

Quantum computers have intrinsic errors, so algorithms can natively run with typically only a few hundred to thousand logic operations. To run the most powerful and useful algorithms (e.g., with millions to billions of logic gates), errors should be reduced to a parts per million or billion range, or lower. Fortunately, this is possible using quantum error correction. The basic idea is to redundantly encode the qubit state in many physical qubits, in a way similar to classical error correction, so that errors in the physical qubit states can be selectively measured, decoded and corrected. For example, the surface code error correction scheme encodes a protected "logical" state with about 1000 physical qubits. If physical errors are small (about 0.1%) and occur randomly and independently among these 1000 qubits, then the logical error can be less than 0.1 part per billion. But if errors are large, then error correction fails. When the logical errors are large, the memory of the quantum computer is lost, and the algorithm fails.

A dominant mechanism for qubit error is the decay of the qubit state. A dominant source of this loss comes from amorphous surface oxides, arising from random bonds of the thin (few nm) natural oxides of the metal and silicon substrate that is used to fabricate the qubit devices.

SUMMARY

Superconducting qubits can be thought of as an inductor-capacitor resonator, with the superconducting Josephson junction giving a non-linear inductance that allows the two lowest energy levels to behave as a qubit. The Josephson junction and the capacitance are designed to be separate physical entities, as illustrated in FIG. 1, and thus can be separately optimized. The size of the Josephson junction is about 100 nm. Its natural capacitance is negligible and junction defects are statistically unlikely because of its small size; the junction can thus typically be modeled as bringing no energy loss. The capacitance is made from superconducting pads with a relatively large millimeter size and about 100 μm spacing, producing a capacitance of about 100 fF for the transmon qubit. When the capacitor is designed properly with control lines weakly coupled to an external circuit, surface loss from oxides of the superconductor and substrate is the dominant mechanism of energy loss. As for any surface loss mechanism, it has been found experimentally that increasing the size of this capacitor lowers the net effect of the surface loss on the qubit device.

Embodiments of the invention relate to the design of the wires that connect the Josephson junction to the capacitor pads. These wires typically have a width approximately the size of the junction, about 100 nm, and extend in length from the junction to the capacitor pads, about 50 μm. Although their width might increase with distance from the junction, the wires are typically narrow compared to their length and thus have large electric fields at their surface. Their long length and narrow width consequently produce significant surface loss. Embodiments of the invention significantly increase the width of the wires to reduce the surface loss, which may be accomplished by tapering the wires outward between the Josephson junction and capacitor pads. This is illustrated in FIG. 1 for untapered (straight) 103 and tapered 104 wires. Since the surface electric fields scale inversely with width, a larger width reduces their field strength. As the total energy of the surface loss scales as the width multiplied by the square of the surface electric fields, the net surface loss scales inversely with width.

Formulas for the surface loss are also important, which have not been expressed in prior work because of the non-uniform surface fields for thin-film devices. These formulas aid the optimization of key parameters and show that the junction wire is likely a dominant loss mechanism in current designs. This methodology allows the designer to separate out all the loss mechanisms, instead of modeling the entire device at once using 3-D capacitance solvers with numerical calculations. Such solvers are always of concern given the range of size scales that matter in the problem, from nm thick oxides to mm sized capacitor pads, where it is difficult to numerically mesh over all the important length scales. These formulas are thus helpful in understanding how to optimally design each component of the qubit capacitance and the junction wires.

The total device loss can usually be broken up into surface-loss components, as shown in FIG. 2 for the ribbon 202, coplanar 203, and wire 204 capacitances. An example of a coplanar design is shown in detail in FIG. 3. In order to give useful design formulas for various geometries of the qubit capacitor, the surface loss is analyzed for these three cases and for an additional simple geometry of a parallel plate capacitor. A design can typically be modeled as a combination of these geometries, thus enabling surface loss predictions from formulas derived here.

Formulas are also given for the wire that connects the junction to the capacitor, both for the untapered and tapered design, with results shown in FIG. 4. This plot shows that a significant improvement can be obtained with tapering. Improved performance can also be obtained by lowering the electric field underneath the junction wires, using free-standing wires obtained by etching the silicon substrate underneath the wires.

Figure 1:
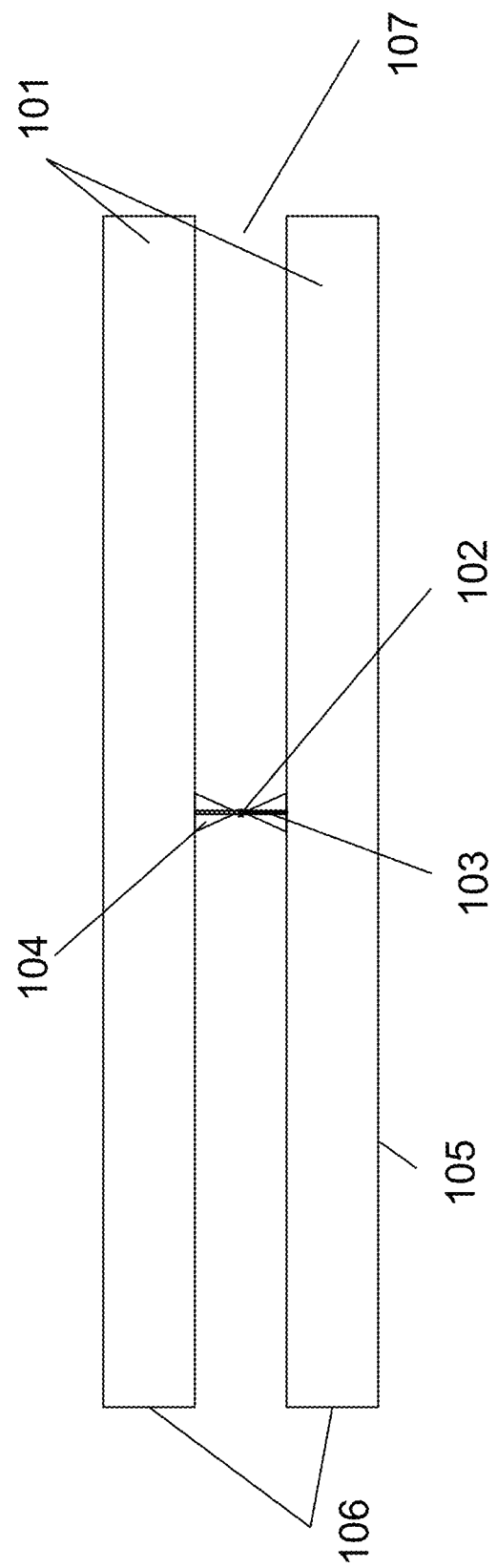
FIG. 1 is a plan view of the differential thin-film transmon device, in accordance with an embodiment of the invention. The two long ribbons of width 106, length 105 and separation 107 are the qubit capacitor 101. They are connected to the junction 102 via junction wires drawn for the untapered 103 and tapered 104 designs.
Figure 2:
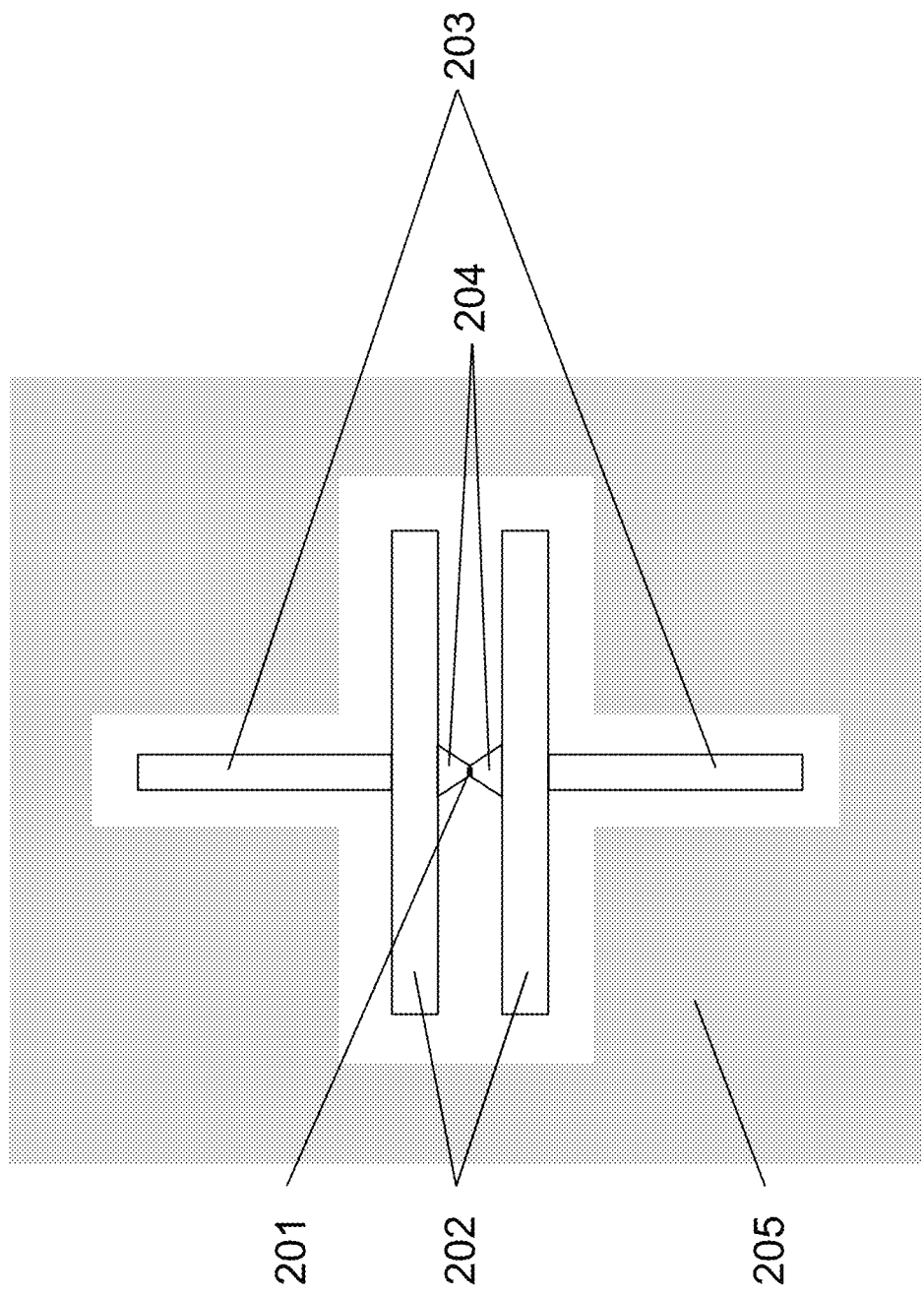
FIG. 2 is a plan view of an example differential transmon qubit, with junction 201 and taped junction wires 204, in accordance with an embodiment of the invention. The qubit capacitance is a composite of a ribbon 202 and coplanar 203, both surrounded by a ground plane 205.

The figures depict various embodiments of the present invention for purposes of illustration only. One skilled in the art will readily recognize from the following discussion that alternative embodiments of the structures and methods illustrated herein may be employed without departing from the principles of the invention described herein.

DETAILED DESCRIPTION

For thin films suitable for superconducting qubits, the electric fields have to be calculated numerically. Fortunately, realistic transmon designs are well approximated by simple geometries with fields that can be well described using simple fitting functions, so that they can be physically understood and optimized. Two-dimensional geometries are particularly amenable to efficient numerical solutions, even though the electric fields diverge at the film edges. The fitting functions for the electric field generally scale as $1/r_c^{1/2}$, where $r_c$ is the distance from the edge of a long thin film. The effect of the thickness t of the film can be included by modifying the above scaling for distances $r_c < t/2$ by matching the electric field magnitude at t/2 but having it continue to scale as $1/r_c^{1/3}$. More accurate results may be obtained by modifying fit functions based on this scaling to numerical results.

From these surface electric fields $E_s$, the effective loss tangent $\tan(\delta_{eff})$ from all of the surface loss can be calculated by a standard integration of the field energy over the surface $$\tan(\delta_{eff}) = \text{SurfaceIntegral}(E_s^2 t_s \tan(\delta) \varepsilon/2)/(CV^2/2),$$

where $t_s$ is the thickness of the lossy surface (typically a few nm), $\tan(\delta)$ is its surface dielectric loss (typically 0.002), c is the surface dielectric constant, and $CV^2/2$ is the total capacitive energy of the device. As $E_s$ scales with V, this formula is independent of the size of the field and only depends on geometry and the dissipation physics.

For the practical situation of the device fabricated on a silicon substrate with relative dielectric constant $\varepsilon_S = 10$, the loss is broken up into interface (surface) components of the metal-substrate (MS), metal-air (MA) and substrate-air (SA). Their relative dielectric constants are $\varepsilon_{MA}$, $\varepsilon_{MS}$, and $\varepsilon_{SA}$, with typical values of 10, 3.8, and 3.8 respectively. To compute the surface loss for the three interfaces, the numerical results for $\tan(\delta_{eff})$ are first computed with a relative dielectric constant of 1, is then scaled by the dielectric constants for the 3 interfaces:

$$\tan(\delta_{MA}) = (1/\varepsilon_{MA})\tan(\delta_{eff}),$$

$$\tan(\delta_{MS}) = (\varepsilon_S^2/\varepsilon_{MS})\tan(\delta_{eff}),$$

$$\tan(\delta_{SA}) = (\varepsilon_{SA})\tan(\delta_{eff}).$$

The dielectric constant terms in parenthesis for these formulas are typically 0.1, 26 and 3.8, so the MS interface typically dominates by a large factor. Only the dominant interface is discussed below.

A differential parallel plate capacitor typically uses a vacuum ("air") dielectric between the parallel plates. Thus the dominant dielectric loss tangent is from the MA term, giving $$\tan(\delta_{PP}) = (1/\varepsilon_{MA})\tan(\delta_{MA})(t_{MA}/L_C)(A/s^2),$$

where $\tan(\delta_{MA})$ is the loss tangent and $t_{MA}$ is the thickness of the surface oxide, $L_C = C/\varepsilon_0$ is the qubit total capacitance expressed in distance units, typically with $L_C = 11.3$ mm, and A is the area of the parallel plates and s are their separation distance.

For a differential ribbon capacitor shown in FIG. 1, the dominant loss comes from the MS interface, with loss tangent $$\tan(\delta_{DR}) = (\varepsilon_S^2/\varepsilon_{MS})\tan(\delta_{MS})(t_{MS}/L_C)(L_r/d)(1+2.2(d/w)^{0.8})(1/\pi^2)(\ln(4\ d/t)+4.1),$$

where $\tan(\delta MS)$ is the loss tangent and $t_{MS}$ is the thickness of the surface oxide, $L_r$ is the length of the ribbon (105), w is the width of ribbon (106), 2 d is the gap between the ribbons (107), and t is the metal thickness.

Figure 3:
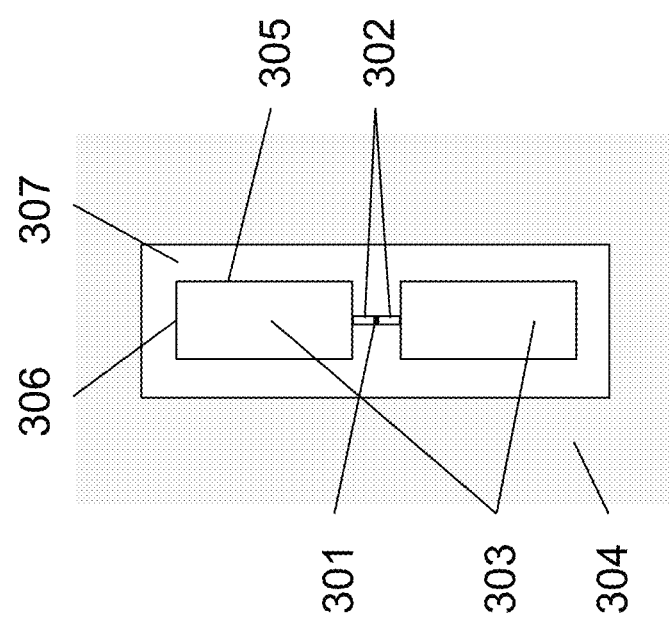
FIG. 3 is a plan view of a differential coplanar capacitor, with junction 301 and junction wires 302, here untapered, in accordance with an embodiment of the invention. The qubit capacitor 303 with width 306 and length 305 is separated from the ground plane 304 by a gap 307.

For a differential coplanar capacitor shown in FIG. 3 embedded in a ground plane 304, the dominant loss comes from the MS interface, with loss tangent $$\tan(\delta_{DC}) = (\varepsilon_S^2/\varepsilon_{MS})\tan(\delta_{MS})(t_{MS}/L_C)[2L_c/w+2L_c/(w+2g)](0.33c_c/\pi)^2(\ln(2\ w/t)+4.1), c_c = \ln[2(1+\text{sqrt}[w/(w+2g)])/(1-\text{sqrt}[w/(w+2g)])],$$

where $L_c$ is the length of the coplanar pad (305), w is the width of pad (306), and g is the gap between the ribbons (307). The logarithmic dependence for $c_c$ enables an approximation for the typical case w=g, giving $c_c$=2.

For the case of an untapered (straight) wire as shown in FIG. 1, the dominant loss comes from the MS interface, with loss tangent $$\tan(\delta_{UW}) = (\varepsilon_S^2/\varepsilon_{MS})\tan(\delta_{MS})(t_{MS}/L_C)(d/w)(\ln(2\ w/t)+4.1)/\ln^2(2\ d/w),$$

where 2 d is the total length of the wire and w is the width of the wire. For the case of the tapered wire, the loss tangent is $$\tan(\delta_{TW}) = (\varepsilon_S^2/c_{MS})\tan(\delta_{MS})(t_{MS}/L_C)(\ln(2\ d/w_0)/S)0.44(\ln(4Sd/t)+4.1)/\ln^2(4/S)$$

where $w_0$ is the width of the wire at the junction, and S is the slope of the taper for one edge. Here S=0 corresponds to an untapered wire, and the latter formula is only valid for S>0.05.

In one embodiment, the wire has a linear taper, where the slope of the wire is constant. As used herein, slope is defined as the change in thickness of the wire along its length. In various embodiments the taper of the electrical connection has slope of at least 0.2, at least 0.1, or any other suitable slope range. In another embodiment, the wire has a smooth taper that may be nonlinear, where "smooth" means that the slope of the wire is free of discontinuities or sharp edges.

Figure 4:
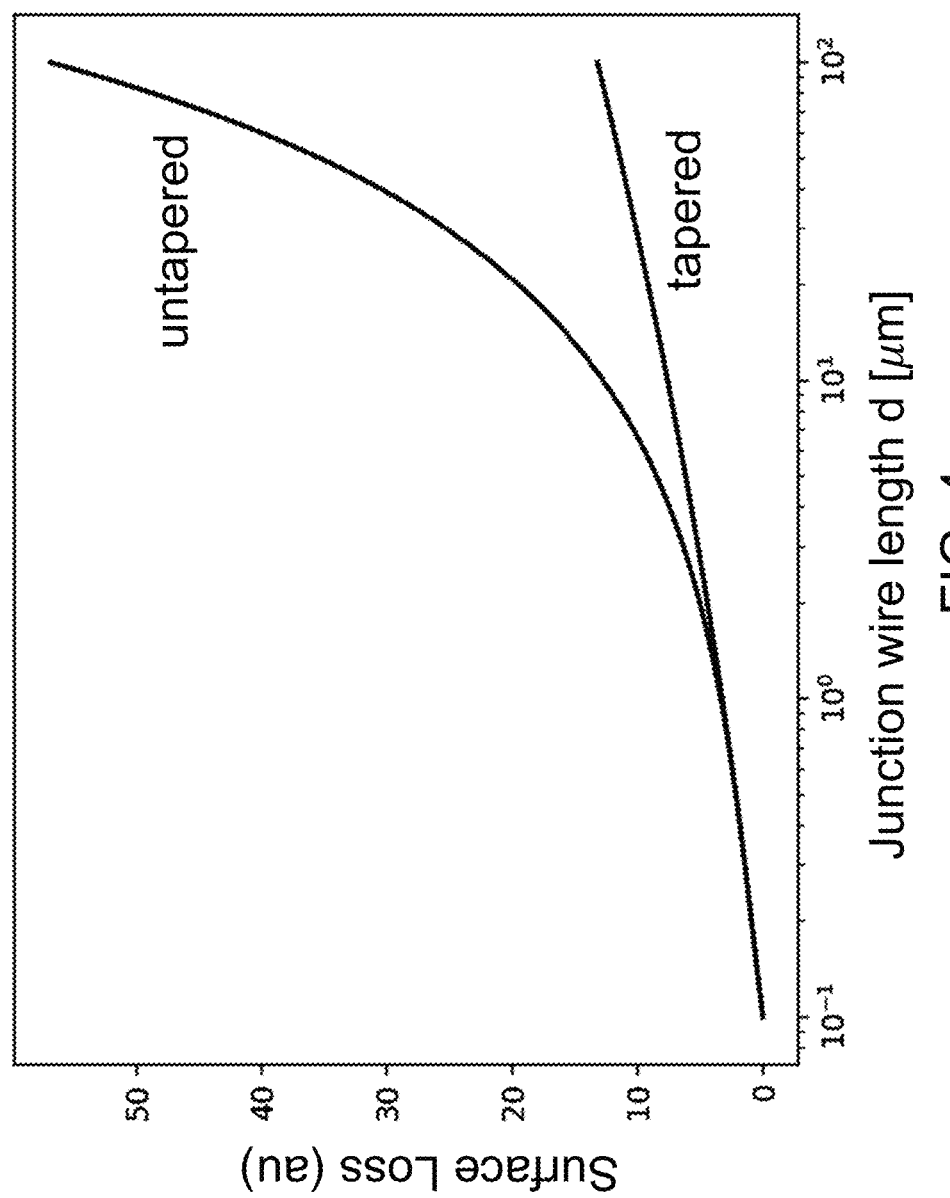
FIG. 4 is a plot of the surface loss (arbitrary units) versus the junction wire length, for both a tapered and untapered design, in accordance with an embodiment of the invention.

A comparison of the untapered (straight) and tapered wire is shown in FIG. 4, which shows significantly lower loss for a distance d of the junction wire greater than about 10 μm. Here t=w/2=0.1 μm and S=0.4. This design would improve present transmon qubits.

Another method to decrease the MS surface loss of the tapered wires is to decrease the electric field at this interface by etching the silicon substrate under the junction wires. Comparing the epsilon factors for the MA and MS, this could give a large decrease in loss. Since the relative dielectric constants between silicon and air is 10, a 5 μm or greater etch would approximately appear as a 50 μm increase in the distance between the wires. Since this is approximately the distance d between the junction and the end of the wire, this will decrease the electric field. Since the surface loss of the wires only begin to be important beyond a distance d of about 5-10 μm, it is possible to undercut only the junction wires from the end to within 3-10 μm of the junction. This is useful since not freely suspending the junction will increase their fabrication reliability and stability. Standard silicon etching techniques can be used, such as Xenon-difluoride vapor, which will not degrade the aluminum wires.

While this specification contains many specific details of the implementation, these should not limit the scope of any inventions or what may be claimed, but rather as descriptions to features specific to particular embodiments. Certain features described in this specification in the context of specific embodiments can also be implemented in a single embodiment. Conversely, various features that are described in context of a single embodiment can also be implemented in multiple embodiments separately or in any combination. The foregoing description of the embodiments of the invention has been presented for the purpose of illustration; it is not intended to be exhaustive or to limit the invention to the precise forms disclosed. Persons skilled in the relevant art can appreciate that many modifications and variations are possible in light of the above disclosure. Finally, the language used in the specification has been principally selected for readability and instructional purposes, and it may not have been selected to delineate or circumscribe the inventive subject matter. It is therefore intended that the scope of the invention be limited not by this detailed description, but rather by any claims that issue on an application based hereon. Accordingly, the disclosure of the embodiments of the invention is intended to be illustrative, but not limiting, of the scope of the invention, which is set forth in the following claims.

What is claimed is:

1. A superconducting qubit device comprising:
a Josephson tunnel junction;
a capacitor external to the Josephson junction; and
an electrical connection between the Josephson junction and the capacitor, the electrical connection comprising a tapered wire that has a narrower width at the Josephson junction and a wider width at the capacitor.

2. The superconducting qubit device of claim 1, wherein the electrical connection has a smooth taper.

3. The superconducting qubit device of claim 1, wherein the electrical connection has a linear taper.

4. The superconducting qubit device of claim 3, wherein the taper of the electrical connection has slope of at least 0.2.

5. The superconducting qubit device of claim 3, wherein the taper of the electrical connection has slope of at least 0.1.

6. The superconducting qubit device of claim 1, wherein the length of the tapered electrical connection from the capacitor to the Josephson junction is approximately 50 µm.

7. The superconducting qubit device of claim 1, wherein the substrate is etched underneath the taper.

8. The superconducting qubit device of claim 7, wherein the substrate is etched underneath the taper at least approximately 5 µm.

9. The superconducting qubit device of claim 1, wherein the substrate is etched underneath the taper and unetched underneath the junction.

10. The superconducting qubit device of claim 9, wherein the substrate is etched underneath the taper at least approximately 5 µm.

11. The superconducting qubit device of claim 9, wherein the substrate is unetched within 5 µm of the junction.

12. A superconducting qubit device comprising:
a Josephson tunnel junction;
a capacitor external to the Josephson junction; and
an electrical connection between the Josephson junction and the capacitor, wherein the surface loss of the device is modeled by:
a parallel plate capacitor, having an effective loss tangent $$\tan(\delta_{PP}) = (1/\varepsilon_{MA})\tan(\delta_{mA})(t_{MA}/L_C)(A/s^2),$$

where $\tan(\delta_{PP})$ is the effective loss tangent of the parallel plate capacitor,
$\varepsilon_{MA}$ is dielectric constant of the metal-air interface,
$\tan(\delta_{MA})$ is the loss tangent of the metal-air interface,
$t_{MA}$ is the thickness of the metal-air interface,
$L_C = C/\varepsilon_0$ is the total capacitance C divided by the vacuum permittivity,
A is the area of the parallel plate, and
s is the separation of the parallel plates;
a ribbon capacitor, having an effective loss tangent $$\tan(\delta_{DR}) = (\varepsilon_S^2/\varepsilon_{MS})\tan(\delta_{MS})(t_{MS}/L_C)(L_r/d)(1+2.2(d/w)^{0.8})(1/\pi^2)(\ln(4\,d/t)+4.1),$$

where $\tan(\delta_{DR})$ is the effective loss tangent of the differential ribbon capacitor,
$\varepsilon_S$ is dielectric constant of the substrate,
$\varepsilon_{MS}$ is dielectric constant of the metal-substrate interface,
$\tan(\delta_{MS})$ is the loss tangent of the metal-substrate interface,
$t_{MS}$ is the thickness of the metal-air interface oxide,
$L_C = C/\varepsilon_0$ is the total capacitance C divided by the vacuum permittivity,
$L_r$ is the length of the ribbon capacitor,
2 d is the distance between the two electrodes of the ribbon capacitor,
w is the width of each electrode of the ribbon capacitor,
t is the thickness of each electrode of the ribbon capacitor;
a differential coplanar capacitor, having an effective loss tangent $$\tan(\delta_{DC}) = (\varepsilon_S^2/\varepsilon_{MS})\tan(\delta_{MS})(t_{MS}/L_C)[2L_c/w+2L_c/(w+2g)](0.33c_c/\pi)^2(\ln(2\,w/t)+4.1),$$

where $\tan(\delta_{DC})$ is the effective loss tangent of the differential coplanar capacitor,
$\varepsilon_S$ is dielectric constant of the substrate,
$\varepsilon_{MS}$ is dielectric constant of the metal-substrate interface,
$\tan(\delta_{MS})$ is the loss tangent of the metal-substrate interface,
$t_{MS}$ is the thickness of the metal-air interface oxide,
$L_C = C/\varepsilon_0$ is the total capacitance C divided by the vacuum permittivity,
$L_c$ is the length of the coplanar capacitor,
w is the width of inner coplanar electrode,
g is the gap between the inner electrodes and the ground plane,
t is the thickness of each electrode of the coplanar capacitor, and
$c_c = \ln[2(1+\text{sqrt}[w/(w+2g)])/(1-\text{sqrt}[w/(w+2g)])]$;
an untapered junction wire, having an effective loss tangent $$\tan(\delta_{UW}) = (\varepsilon_S^2/\varepsilon_{MS})\tan(\delta_{MS})(t_{MS}/L_C)(d/w)(\ln(2\,w/t)+4.1)/\ln^2(2\,d/w),$$

where $\tan(\delta_{UW})$ is the effective loss tangent of the untapered wire,
$\varepsilon_S$ is dielectric constant of the substrate,
$\varepsilon_{MS}$ is dielectric constant of the metal-substrate interface,
$\tan(\delta_{MS})$ is the loss tangent of the metal-substrate interface,
$t_{MS}$ is the thickness of the metal-air interface oxide, $L_C=C/\varepsilon_0$ is the total capacitance C divided by the vacuum permittivity, d is the length of the wire from the junction to the capacitor electrode, w is the width of wire, and t is the thickness of wire; and a tapered junction wire, having an effective loss tangent:

$$\tan(\delta_{TW})=(\varepsilon_S^2/\varepsilon_{MS})\tan(\delta_{MS})(t_{MS}/L_C)(\ln(2\ d/w_0)/S)0.44\ (\ln(4\ Sd/t)+4.1)/\ln^2(4/S),$$

where $\tan(\delta_{TW})$ is the effective loss tangent of the untapered wire, $\varepsilon_S$ is dielectric constant of the substrate, $\varepsilon_{MS}$ is dielectric constant of the metal-substrate interface, $\tan(\delta_{MS})$ is the loss tangent of the metal-substrate interface, $t_{MS}$ is the thickness of the metal-air interface oxide, $L_C=C/\varepsilon_0$ is the total capacitance C divided by the vacuum permittivity, d is the length of the wire from the junction to the capacitor electrode, $w_0$ is the initial width of the wire at the junction, S is the slope of the taper, and t is the thickness of wire.

\* \* \* \* \*